(12) United States Patent
Suzuki

(10) Patent No.: US 6,737,903 B2
(45) Date of Patent: May 18, 2004

(54) SEMICONDUCTOR INTEGRATED CIRCUIT DEVICE WITH CLOCK DISTRIBUTION CONFIGURATION THEREIN

(75) Inventor: Hiroaki Suzuki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/252,799

(22) Filed: Sep. 24, 2002

(65) Prior Publication Data

US 2003/0062949 A1 Apr. 3, 2003

(30) Foreign Application Priority Data

Sep. 28, 2001 (JP) ........................................ 2001-299829

(51) Int. Cl.[7] .............................. G06F 1/04; H03K 3/00
(52) U.S. Cl. ..................... 327/293; 327/295; 327/564
(58) Field of Search ................................. 327/291, 293, 327/295, 297, 564

(56) References Cited

U.S. PATENT DOCUMENTS 5,164,817 A * 11/1992 Eisenstadt et al. .......... 327/297
6,150,865 A * 11/2000 Fluxman et al. ............ 327/292
6,313,683 B1 * 11/2001 Block et al. ................ 327/295
6,440,780 B1 * 8/2002 Kimura et al. .............. 438/129

FOREIGN PATENT DOCUMENTS

JP 11-74466 3/1999

* cited by examiner

Primary Examiner—Terry D. Cunningham
Assistant Examiner—Quan Tra
(74) Attorney, Agent, or Firm—McDermott, Will & Emery

(57) ABSTRACT

A semiconductor integrated circuit device includes internal circuits divided into blocks that are controlled block by block for activation. Each internal circuit receives a clock signal from a clock distribution network of a block including that internal circuit. The clock signal is supplied to the clock distribution network by buses of a tree structure and a clock drive control gate. The clock drive control gate stops, in response to an enable signal for controlling activation of internal circuits block by block, the clock signal from being supplied, when internal circuits of a corresponding block are inactivated.

15 Claims, 11 Drawing Sheets

US 6,737,903 B2

SEMICONDUCTOR INTEGRATED CIRCUIT DEVICE WITH CLOCK DISTRIBUTION CONFIGURATION THEREIN

BACKGROUND OF THE INVENTION

1. Field of the Invention

The present invention relates to semiconductor integrated circuit devices and particularly to a semiconductor integrated circuit device having a plurality of internal circuits that operate in synchronization with a clock signal.

2. Description of the Background Art

For semiconductor integrated circuit devices typified by LSI (large-scale integration), a technique is commonly employed by which the operation timing of internal circuits of a semiconductor integrated circuit device is controlled according to a reference clock signal to allow the internal circuits to operate synchronously.

The semiconductor integrated circuit device having its configuration in which the clock signal is distributed to a large number of internal circuits of the device suffers from a problem of a relative phase shift of the clock signal, which is also called clock skew, due to different paths through which the clock signal is transmitted for example. A configuration generally employed for the purpose of reducing the clock skew distributes the clock signal by one of the so-called clock mesh method and clock tree method.

FIG. 19 schematically shows conventional distribution of a clock signal by the clock mesh method.

Referring to FIG. 19, in accordance with the clock mesh method, a mesh distribution network 500 in the form of a grid is provided over the entire area of the semiconductor integrated circuit device. A clock signal CLK is transmitted by a clock driver 520 to mesh distribution network 500.

An internal circuit 530 is constituted of a flip-flop or data latch that inputs/outputs data in response to clock signal CLK for example. Each internal circuit 530 receives clock signal CLK from a line drawn from the nearest node on mesh distribution network 500. The clock mesh method is advantageous in that the clock skew between internal circuits 530 is small since all internal circuits 530 are connected with each other with the minimum distance therebetween through mesh distribution network 500.

However, this mesh-like distribution network has a problem that the total length of lines for transmitting the clock signal is long, which results in a greater amount of charging and discharging current of mesh distribution network 500 and accordingly results in increase in the power consumption.

FIG. 20 schematically shows conventional distribution of a clock signal according to the clock tree method.

Referring to FIG. 20, in accordance with the clock tree method, all internal circuits 530 are connected via a distribution node 560 through a tree distribution network 550 in the form of a symmetrical and hierarchical binary tree. In this configuration, propagation delays of clock signal CLK transmitted from an input node Ni to respective internal circuits 530 are theoretically equal to each other. Then, the clock skew at each internal circuit 530 is theoretically zero. Moreover, a clock driver may be provided at distribution node 560 as required for waveform shaping of clock signal CLK.

In particular, the clock driver may additionally have an AND logic function to stop clock signal CLK from being supplied to any inactivated internal circuit. Power consumption of the semiconductor integrated circuit device is thus reduced. This configuration is also called gated clock configuration that is commonly employed by a processor adapted for low power consumption.

The clock tree method, however, actually has difficulty in shaping tree distribution network 550 into the theoretically symmetrical binary tree. Therefore, the effective clock skew could be larger than that of the clock mesh method in many cases.

On the other hand, the clock mesh method is implemented on the precondition that lines constituting mesh distribution network 500 for transmitting the clock signal are connected at low impedance, which makes it difficult to use the gated clock configuration as that of the clock tree method. In other words, the clock mesh method has a problem that power consumption is difficult to cut.

As discussed above, the clock mesh method and the clock tree method which are employed for conventional clock signal distribution respectively have the problem in reduction of power consumption and the problem of clock skew.

SUMMARY OF THE INVENTION

One object of the present invention is to provide a configuration of a semiconductor integrated circuit device having a clock distribution structure for distributing a clock signal with smaller clock skew and lower power consumption.

In summary, according to one aspect of the present invention, a semiconductor integrated circuit device includes a group of clock buses, a plurality of internal circuits, a plurality of clock distribution networks, and a plurality of clock drive control units. The group of clock buses has a hierarchical tree structure provided for transmitting a clock signal. The internal circuits are divided into a plurality of blocks and the internal circuits each receive the clock signal to operate when activated. Activation of the internal circuits is controlled block by block. The clock distribution networks are provided correspondingly to the blocks respectively, each for transmitting the clock signal to the internal circuits of a corresponding one of the blocks. The clock drive control units are provided correspondingly to the blocks respectively, each for supplying the clock signal from the group of clock buses to a corresponding one of the clock distribution networks. Each of the clock drive control units stops supply of the clock signal when internal circuits of the corresponding block are inactivated.

According to another aspect of the present invention, a thin-film magnetic memory device includes a plurality of first internal circuits, a plurality of second internal circuits, a plurality of first clock distribution networks, a plurality of second clock distribution networks, and a connection switch. The first internal circuits are divided into a plurality of first blocks, and the first internal circuits are each activated with receiving a first clock signal to operate. The second internal circuits are divided into a plurality of second blocks, and the second internal circuits each receive a second clock signal to operate when activated. The second clock signal has a frequency N times (N: integer of at least 2) as high as that of the first clock signal and is in phase with the first clock signal. Activation of the first and second internal circuits is controlled block by block. The first clock distribution networks are provided correspondingly to the first blocks respectively, for transmitting the first clock signal to the first internal circuits of corresponding first blocks respectively. The second clock distribution networks are provided correspondingly to the second blocks respectively, for transmitting the second clock signal to the second internal circuits of corresponding second blocks respectively. The connection switch is provided between one of the first clock distribution networks and one of the second clock distribution networks. The connection switch connects that one of the first clock distribution networks and that one of the second clock distribution networks at least when the first internal circuits corresponding to that one of first clock distribution networks and the second internal circuits corresponding to that one of second clock distribution networks are all activated in a period in which respective levels of the first and second clock signals coincide with each other.

Thus, the present invention is chiefly advantageous in that a clock signal is supplied through a hierarchical tree structure to each of clock distribution networks provided respectively for blocks each formed of internal circuits that are commonly controlled for activation. The present invention accordingly enjoys both of respective advantages of the clock tree method and the clock mesh method to distribute the clock signal with low power consumption and small clock skew.

Moreover, a connection switch which is controlled depending on activation and inactivation of internal circuits is provided between clock distribution networks that respectively receive clock signals in phase and of different frequencies. Accordingly, the clock signal is distributed with reduced clock skew between the clock distribution networks.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
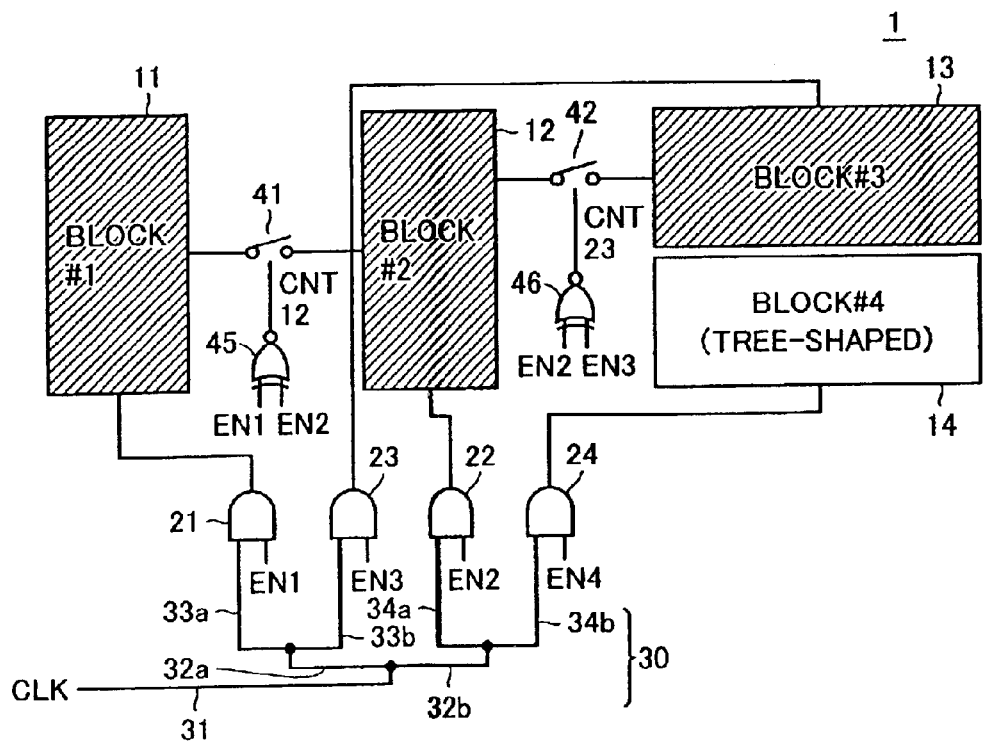
FIG. 1 is a block diagram showing a configuration regarding distribution of a clock signal in a semiconductor integrated circuit device according to a first embodiment.

Embodiments of the present invention are hereinafter described in detail in connection with the drawings. It is noted that the same or corresponding components are denoted by the same reference character.

First Embodiment

FIG. 1 shows a configuration regarding distribution of a clock signal in a semiconductor integrated circuit device according to a first embodiment of the present invention.

Referring to FIG. 1, a semiconductor integrated circuit device 1 according to the first embodiment includes a plurality of internal circuits (not shown) arranged therein. When activated, the internal circuits each receive a clock signal CLK to operate. The internal circuits each correspond to internal circuit 530 shown in FIGS. 19 and 20, that is constituted of a flip-flop or data latch which inputs/outputs data in response to clock signal CLK for example.

These internal circuits are grouped into blocks #1–#4 and arranged accordingly. Activation/inactivation of the internal circuits is controlled block by block. Respective internal circuit groups included in blocks #1–#4 are activated in response to respective enable signals EN1–EN4. Specifically, enable signals EN1–EN4 are each activated to a logical high level (hereinafter "H level") when the internal circuit group in the corresponding block is to be activated, i.e., when clock signal CLK is to be supplied. On the other hand, enable signals EN1–EN4 are each inactivated to a logical low level (hereinafter "L level") when the internal circuit group in the corresponding block is to be inactivated, i.e., when clock signal CLK is unnecessary.

Clock distribution networks 11–14 are provided respectively to corresponding blocks #1–#4. The clock distribution networks are separately provided to respective blocks so that the total length of lines in each clock distribution network is reduced. Accordingly, each clock distribution network consumes relatively small power in transmitting clock signal CLK.

Clock distribution networks 11–14 each transmit clock signal CLK to the internal circuit group belonging to the corresponding block. Clock distribution network 11 is provided over the entire area of block #1 to transmit clock signal CLK with small clock skew to internal circuits belonging to block #1. As clock distribution network 11, clock distribution networks 12 and 13 each are also provided over the entire area of the corresponding block for transmitting clock signal CLK to internal circuits in block #2 or #3. Clock distribution network 14 has a hierarchical tree structure according to the clock tree method shown in FIG. 20 to transmit clock signal CLK to internal circuits belonging to block #4.

Semiconductor integrated circuit device 1 further includes clock drive control gates 21–24 for respective clock distribution networks 11–14 as well as a group of clock buses 30.

The group of clock buses 30 includes clock buses 31, 32a, 33a, 33b, 34a and 34b of a hierarchical tree structure. Clock buses 30 transmit clock signal CLK to clock drive control gates 21–24.

Clock signal CLK supplied to clock bus 31 is transmitted by clock buses 32a and 32b in the shape of a binary tree. Clock signal CLK transmitted by clock bus 32a is further transmitted by clock buses 33a and 33b in the shape of a binary tree to clock drive control gates 21 and 23 respectively. Similarly, clock signal CLK transmitted by clock bus 32b is transmitted by clock buses 34a and 34b in the shape of a binary tree to clock drive control gates 22 and 24 respectively.

Clock buses 30 of the tree structure make up a hierarchy depending on the number of blocks. Then, the depth of the hierarchy is considerably reduced as compared with that according to the conventional clock tree method. In this way, the clock skew between clock buses 30 and clock drive control gates 21–24 can be reduced.

Clock drive control gates 21–24 control supply of clock signal CLK to corresponding clock distribution networks in response to enable signals EN1–EN4 respectively. Specifically, clock drive control gates 21–24 each transmit clock signal CLK to the corresponding clock distribution network when the corresponding enable signal is activated to H level. Clock drive control gates 21–24 each stop transmission of clock signal CLK to the corresponding clock distribution network when the corresponding enable signal is inactivated to L level, i.e., when the internal circuits in the corresponding block are to be inactivated.

Figure 19:
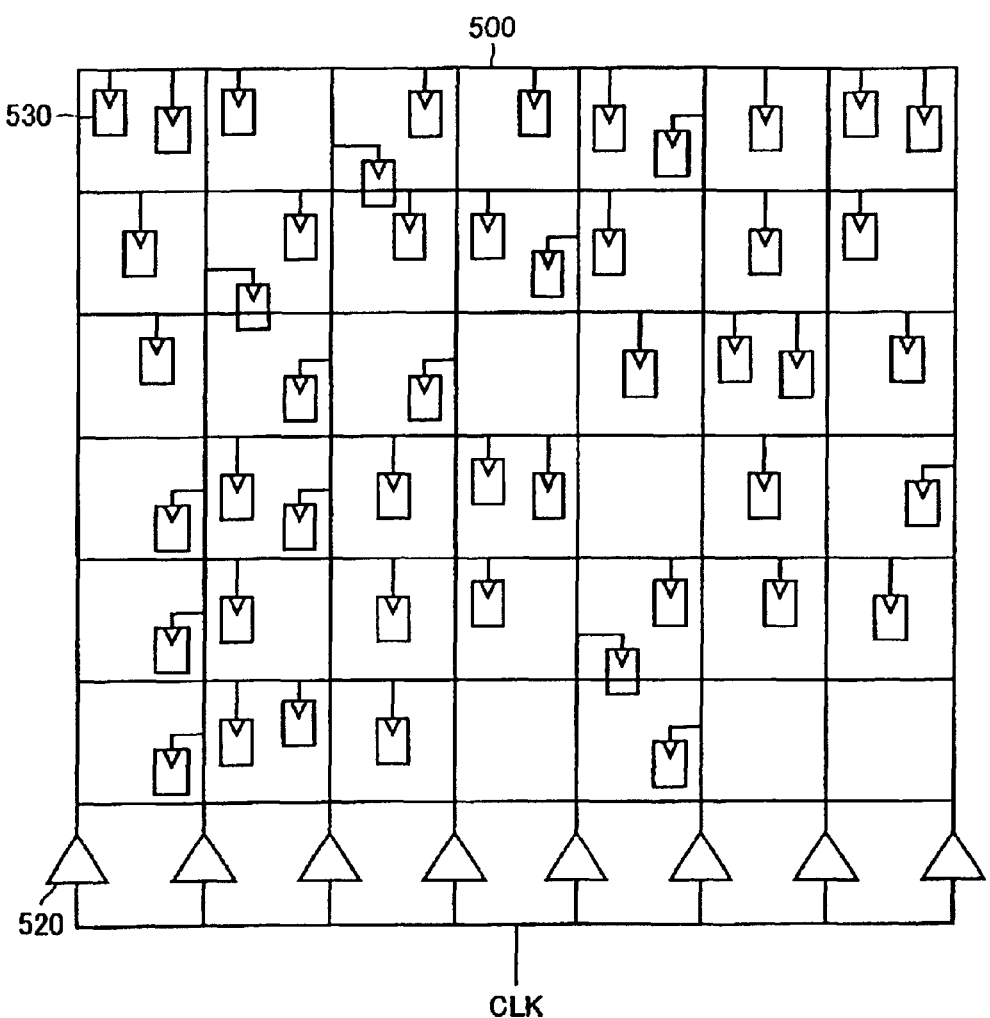
FIG. 19 schematically shows conventional distribution of a clock signal according to the clock mesh method.
Figure 20:
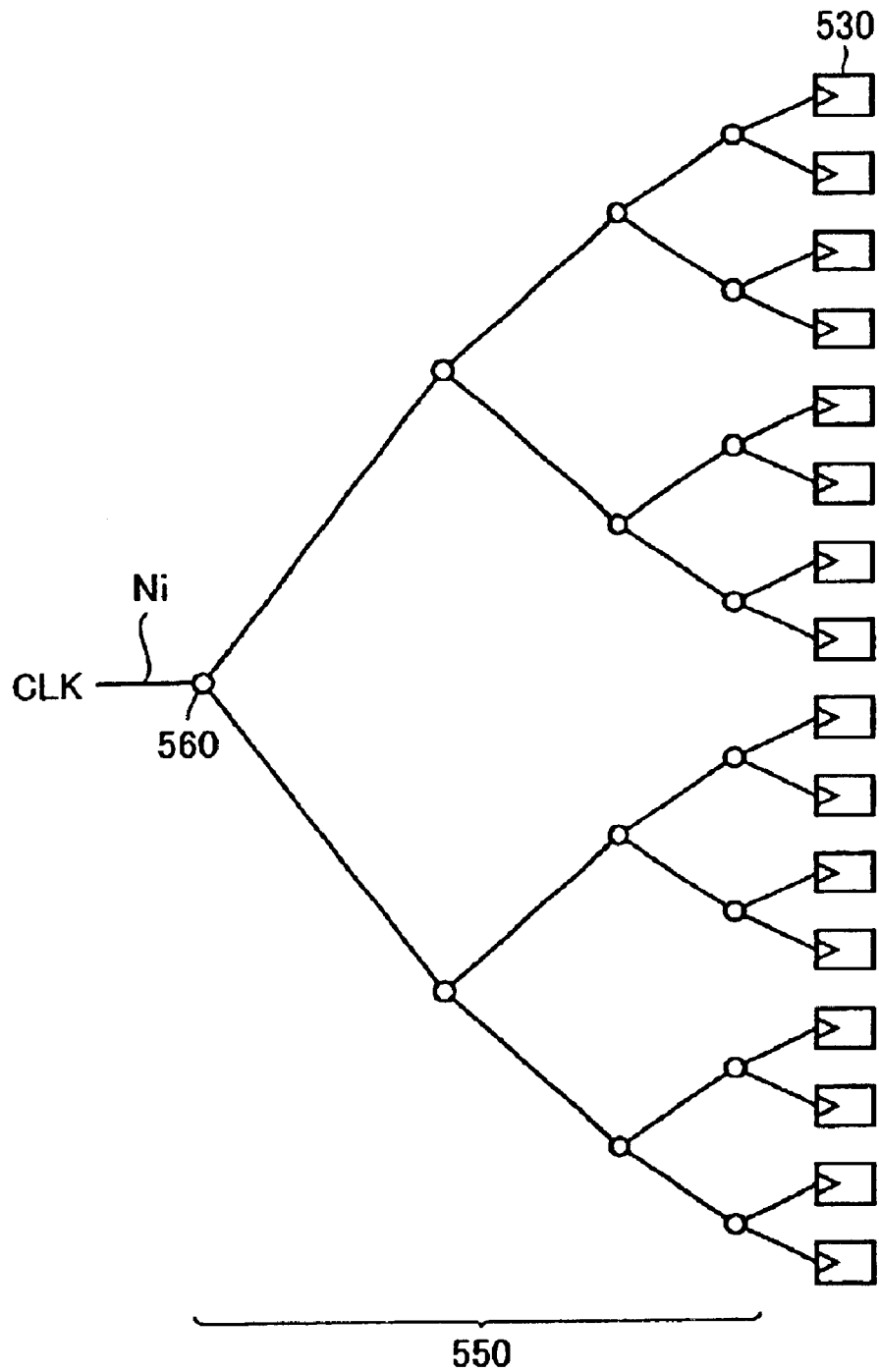
FIG. 20 schematically shows conventional distribution of a clock signal according to the clock tree method.

In the configuration as discussed above, the clock distribution networks are provided to respective blocks according to the clock mesh method shown in FIG. 19 as required and thus the clock skew within one block is reduced. Moreover, supply of clock signal CLK is controlled block by block by clock drive control gates 21–24 so that supply of clock signal CLK to any inactivated internal circuit is stopped to reduce power consumption of semiconductor integrated circuit device 1.

Semiconductor integrated circuit device 1 further includes connection switches provided between mesh-shaped clock distribution networks 11, 12 and 13. FIG. 1 representatively shows, in the configuration, a connection switch 41 provided between clock distribution networks 11 and 12 and a connection switch 42 provided between clock distribution networks 12 and 13.

Connection switches 41 and 42 are turned on/off in response to respective control signals CNT12 and CNT23 supplied respectively from switch control circuits 45 and 46. Switch control circuit 45 outputs control signal CNT12 indicating a result of comparison between enable signals EN1 and EN2 (exclusive NOR). Switch control circuit 46 outputs control signal CNT23 indicating a result of comparison between enable signals EN2 and EN3 (exclusive NOR).

Accordingly, when internal circuits in blocks #1 and #2 are controlled in the same state of activation, i.e., internal circuits in at least both of blocks #1 and #2 are activated, clock distribution networks 11 and 12 are connected by connection switch 41 at low impedance.

Similarly, when internal circuits in blocks #2 and #3 are controlled in the same state of activation, i.e., internal circuits in at least both of blocks #2 and #3 are activated, clock distribution networks 12 and 13 are connected by connection switch 42 at low impedance.

In this configuration, clock distribution networks to which the same clock signal CLK is supplied with the same timing are connected to each other at low impedance. Supply of clock signal CLK is thus controlled block by block to reduce power consumption and further, the clock skew between internal circuits included in different blocks can be reduced.

Figure 2:
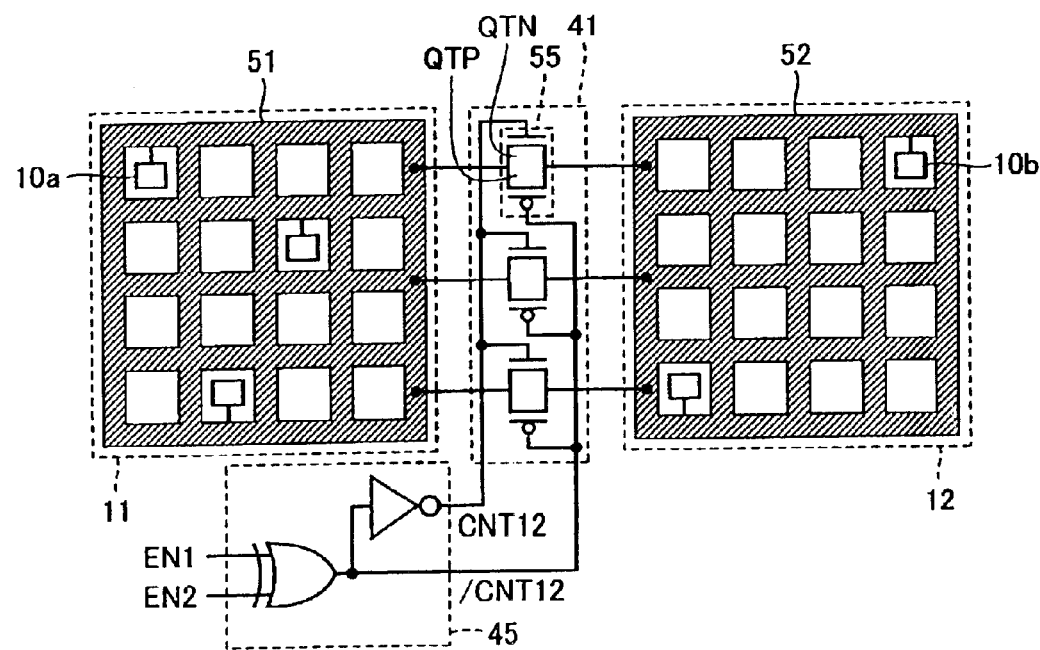
FIG. 2 schematically shows an exemplary arrangement of clock distribution networks and a connection switch shown in FIG. 1.

FIG. 2 schematically shows an exemplary arrangement of the clock distribution networks and connection switch shown in FIG. 1. FIG. 2 representatively shows clock distribution networks 11 and 12 and corresponding connection switch 41.

Referring to FIG. 2, clock signal CLK is transmitted in block #1 by a mesh distribution 51 provided as clock distribution network 11 to cover the region corresponding to block #1. To each internal circuit 10a in block #1, clock signal CLK is transmitted by a line drawn from the nearest node on mesh distribution 51.

Similarly, clock signal CLK is transmitted in block #2 by a mesh distribution 52 provided as clock distribution network 12 to cover the region corresponding to block #2. To each internal circuit 10b in block #2, clock signal CLK is transmitted by a line drawn from the nearest node on mesh distribution 52.

Connection switch 41 includes a plurality of CMOS (Complementary Metal Oxide Semiconductor) transmission gates 55 provided between mesh distributions 51 and 52. CMOS transmission gates 55 each include an N-channel MOS transistor QTN and a P-channel MOS transistor QTP. N-channel MOS transistor QTN has its gate receiving control signal CNT12 from switch control circuit 45 and P-channel MOS transistor QTP has its gate receiving an inverted version of control signal CNT12, namely/CTN12.

In this configuration, connection switch 41 connects corresponding clock distribution networks 11 and 12 at low impedance when the internal circuits in corresponding blocks #1 and #2 are controlled in the same state of activation.

Figure 3:
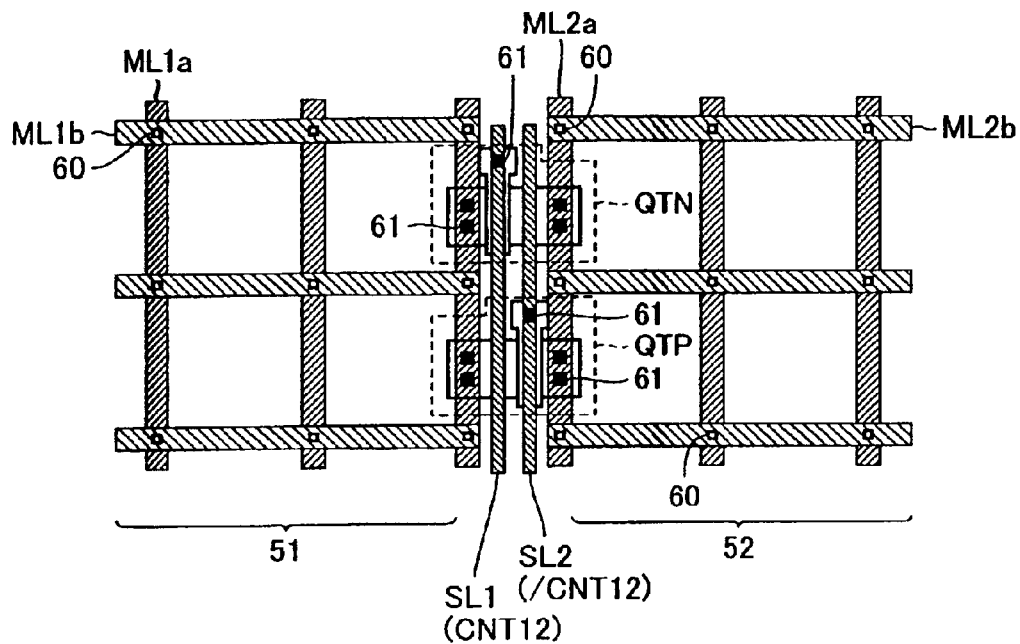
FIG. 3 shows a layout illustrating an exemplary arrangement of CMOS transmission gates shown in FIG. 2.

Referring to FIG. 3, mesh distribution 51 includes metal lines ML1a placed in a first direction, metal lines ML1b placed in a second direction that cross metal lines ML1a, and through holes 60 for electrically coupling metal lines ML1a and ML1b. Similarly, mesh distribution 52 includes metal lines ML2a placed in the first direction, metal lines ML2b placed in the second direction that cross metal lines ML2a, and through holes 60 for electrically coupling metal lines ML2a and ML2b. Metal lines ML1a and ML2a are formed in the same direction in the same metal wiring layer. Similarly, metal lines ML1b and ML2b are formed in the same direction in the same metal wiring layer.

N-channel MOS transistor QTN and P-channel MOS transistor QTP that constitute CMOS transmission gate 55 are provided between metal lines formed in the same direction. For example, transistors QTN and QTP are provided between one of metal lines ML1a and one of metal lines ML2a. More specifically, the source/drain regions of transistors QTN and QTP each are coupled respectively to the metal line ML1a and the metal line ML1b by contacts 61.

Moreover, the gate of N-channel MOS transistor QTN is coupled by contact 61 to a signal line SL1 transmitting control signal CNT12. Similarly, the gate of P-channel MOS transistor QTP is coupled by contact 61 to a signal line SL2 transmitting control signal/CNT12.

In particular, the metal lines connected by the CMOS transmission gates are placed in a lower layer, preferably in the lowest layer, relative to the layer where remaining metal lines are placed, for the purpose of efficiently arranging MOS transistors which constitute CMOS transmission gates. More specifically, in the exemplary configuration shown in FIG. 3, the metal wiring layer where metal lines ML1a and ML2a are formed is preferably located under the metal wiring layer where metal lines ML1b and ML2b are formed.

As discussed above, in the configuration of the first embodiment, clock distribution networks are provided separately to respective blocks and thus the total length of lines in one clock distribution network is relatively short, and the clock signal is supplied to the clock distribution networks through the hierarchical tree structure. Then, both of the advantages of the clock tree method and the clock mesh method are utilized to distribute the clock signal with low power consumption and small clock skew.

Second Embodiment

In the configuration of the first embodiment described above, supply of the clock signal is controlled independently for each of the blocks arranged in different regions respectively. However, most of actual layout designs arrange, in the same block occupying the same region, a plurality of internal circuit groups that must be controlled independently of each other regarding activation.

In a configuration according to a second embodiment described below, the clock signal can be transmitted to a plurality of internal circuit groups arranged in the same region and controlled independently of each other regarding activation.

Figure 4:
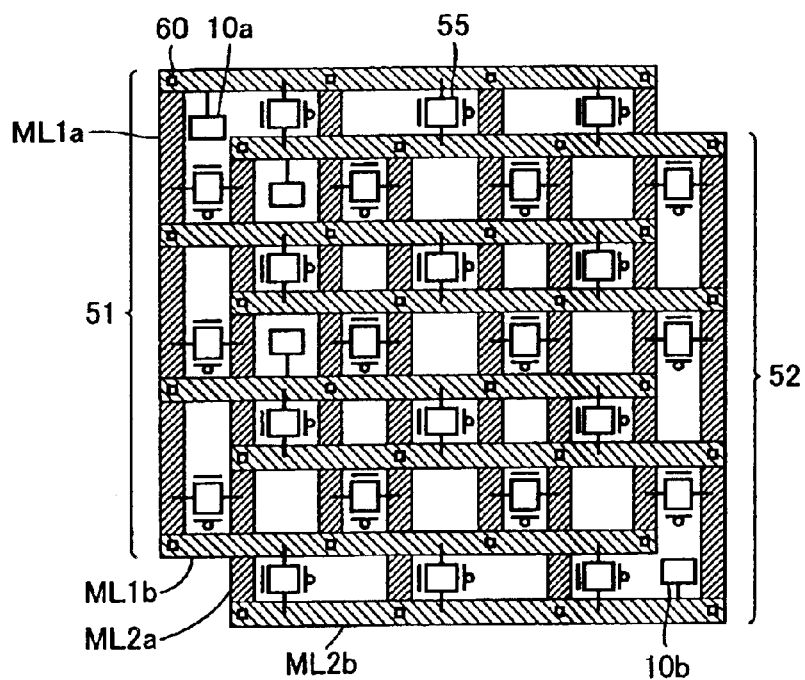
FIG. 4 schematically shows a first exemplary arrangement of clock distribution networks and connection switches according to a second embodiment.

FIG. 4 schematically shows a first exemplary arrangement of clock distribution networks and connection switches. FIG. 4 shows a configuration in which mesh distributions 51 and 52 are provided in the same region.

Referring to FIG. 4, mesh distribution 51 constituted of metal lines ML1a and ML1b and mesh distribution 52 constituted of metal lines ML2a and ML2b are placed to occupy the same region. Moreover, CMOS transmission gates 55 provided between mesh distributions 51 and 52 are each placed between metal lines formed in the same metal wiring layer, i.e., between one of metal lines ML1a and one of metal lines ML2a or between one of metal lines ML1b and one of metal lines ML2b.

CMOS transmission gates 55 are arranged over the entire area of mesh distributions 51 and 52 for connecting the distributions at low impedance. This configuration allows the clock signal to be supplied to a plurality of internal circuit groups that are arranged in the same region and controlled independently of each other for their activation with low power consumption and small clock skew.

Control of ON/OFF of CMOS transmission gates 55 as well as control of supply of clock signal CLK to each mesh distribution are accomplished in the same manner as that of the first embodiment and thus detailed description thereof is not repeated here.

Figure 5:
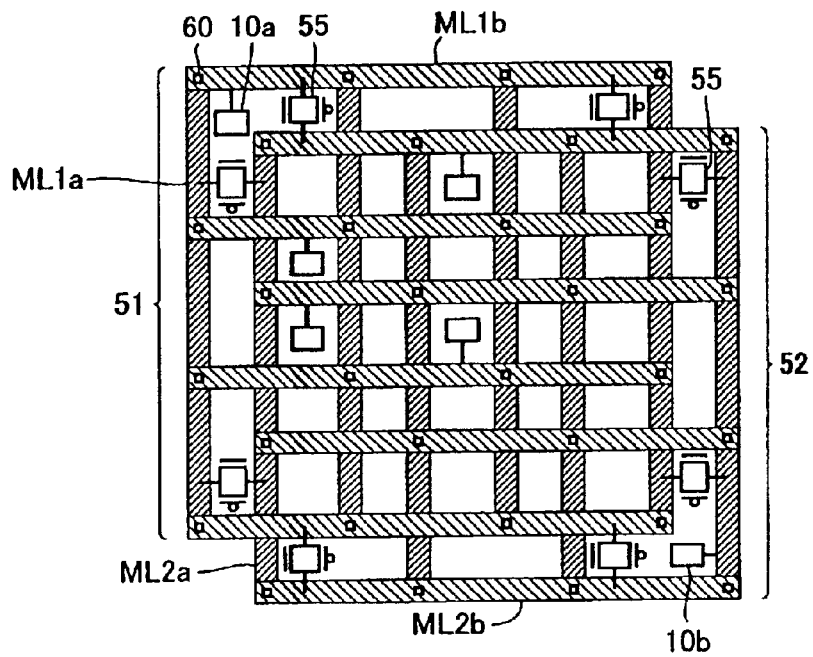
FIG. 5 schematically shows a second exemplary arrangement of clock distribution networks and connection switches according to the second embodiment.

FIG. 5 schematically shows a second exemplary arrangement of clock distribution networks and connection switches according to the second embodiment. FIG. 5 also shows a configuration in which mesh distributions 51 and 52 are provided in the same region.

Referring to FIG. 5, according to the second exemplary arrangement of the second embodiment, CMOS transmission gates 55 are provided at respective locations corresponding to vertexes of grid-like mesh distributions 51 and 52. In this configuration in which the number of CMOS transmission gates is smaller than that in FIG. 4, the clock skew can be made relatively small.

Figure 6:
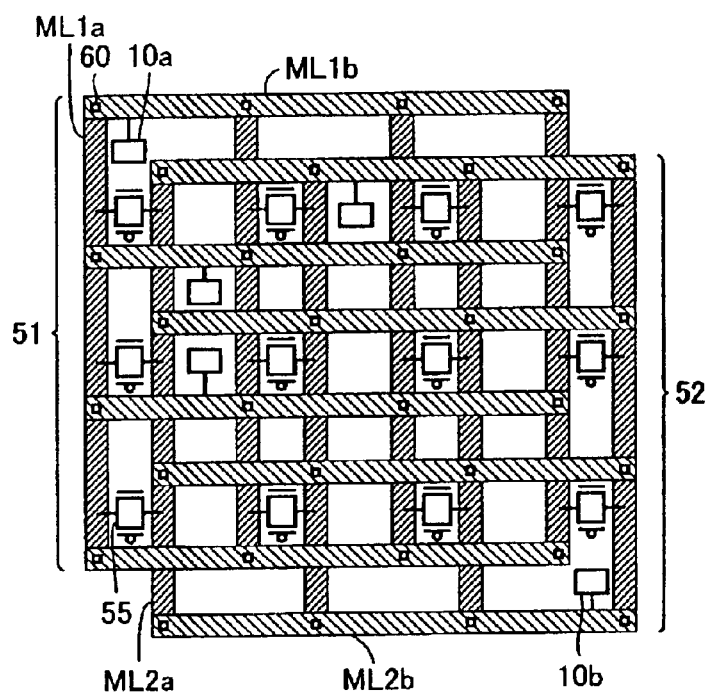
FIG. 6 schematically shows a third exemplary arrangement of clock distribution networks and connection switches according to the second embodiment.

FIG. 6 schematically shows a third exemplary arrangement of clock distribution networks and connection switches according to the second embodiment. FIG. 6 also shows a configuration in which mesh distributions 51 and 52 are provided in the same region.

Referring to FIG. 6, according to the third exemplary arrangement of the second embodiment, CMOS transmission gates 55 are provided selectively between metal lines formed in the same interconnect layer. For example, in the configuration shown in FIG. 6, CMOS transmission gates 55 are arranged only between metal lines ML1a and ML2a extended in the vertical direction. Alternatively, CMOS transmission gates 55 may be arranged only between metal lines ML1b and ML2b extended in the horizontal direction.

In this configuration in which the number of CMOS transmission gates is smaller than that in FIG. 4, the clock skew can be made relatively small. In particular, metal lines connected by the CMOS transmission gates 55 may be placed in the lowest layer and thus the MOS transistors constituting the CMOS transmission gates can efficiently be arranged.

Third Embodiment

Figure 7:
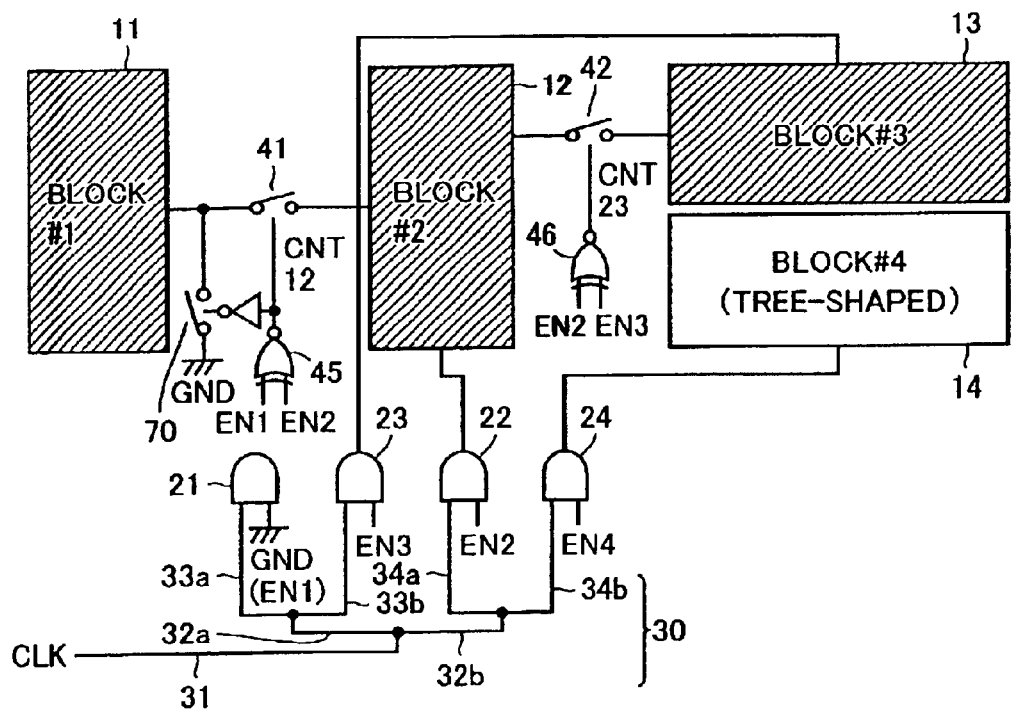
FIG. 7 is a block diagram showing a configuration regarding distribution of a clock signal in a semiconductor integrated circuit device according to a third embodiment.

Referring to FIG. 7, a semiconductor integrated circuit device 2 according to a third embodiment differs from semiconductor integrated circuit device 1 of the first embodiment shown in FIG. 1 in that a part of clock distribution networks is not directly driven by clock drive control gates.

In the configuration shown in FIG. 7, a clock distribution network 11 corresponding to a block #1 is not directly driven by a clock drive control gate 21 to receive clock signal CLK but indirectly driven by a clock drive control gate 22 via a connection switch 41 provided between clock distribution network 11 and a clock distribution network 12 corresponding to a block #2 to receive clock signal CLK.

A connection switch 70 which is made ON/OFF complementarily with connection switch 41 is provided to the indirectly driven clock distribution network 11. Connection switch 70 connects clock distribution network 11 to ground voltage GND in a period in which connection switch 41 is made OFF.

Enable signal EN1 supplied to clock drive control gate 21 is fixed in an inactive state (L level: ground voltage GND). Accordingly, supply of clock signal CLK from clock drive control gate 21 to clock distribution network 11 is stopped all the time. Clock control gate 21 may be dispensed with. Other components in the configuration and operation thereof are the same as those of the configuration of the first embodiment and, detailed description thereof is not repeated here.

Under a special condition that the internal circuit group corresponding to clock distribution network 11 is activated simultaneously with the internal circuit group corresponding to clock distribution network 12, the internal circuit group corresponding to clock distribution network 11 can be operated without operation of clock drive control gate 21. The power consumption of the semiconductor integrated circuit device can further be reduced.

The configuration of the third embodiment is particularly advantageous under the condition described above and further under the condition that the internal circuit group corresponding to block #1 normally operates even with a certain degree of timing skew of clock signal CLK because the internal circuit group of block #1 accepts relatively moderate requirements regarding the clock skew.

The configuration of the third embodiment may be combined with the configuration of the second embodiment to address a configuration in which a plurality of clock distribution networks are provided in the same region.

Fourth Embodiment

According to a fourth embodiment, a fishbone-shaped clock distribution network is described as another exemplary clock distribution network.

Figure 8:
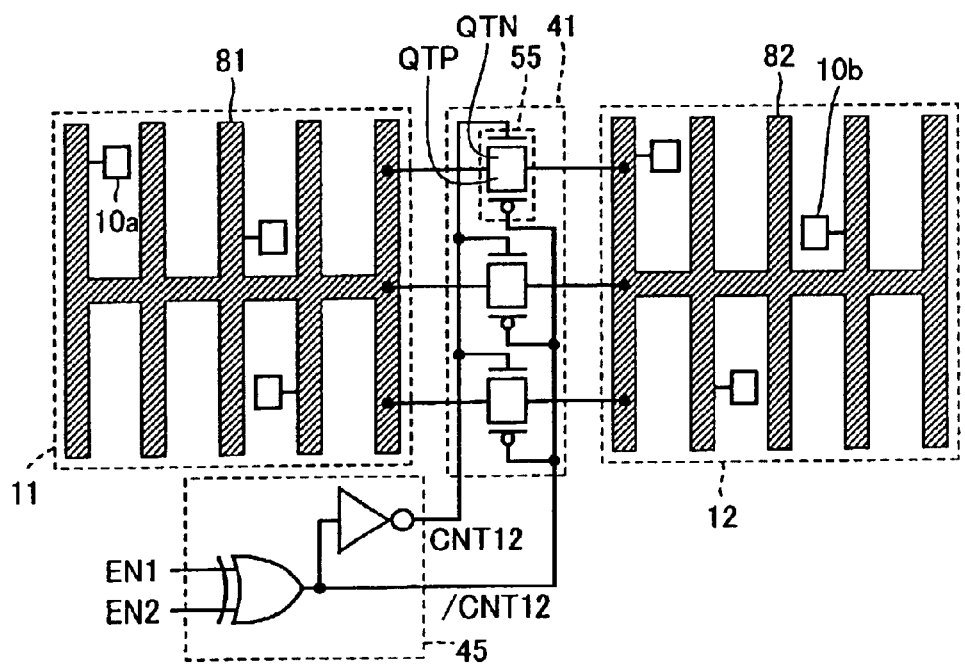
FIG. 8 schematically shows an exemplary arrangement of clock distribution networks and a connection switch according to a fourth embodiment.

Referring to FIG. 8, the configuration of the fourth embodiment differs from that of the first embodiment shown in FIG. 2 in that fishbone distributions 81 and 82 are provided instead of mesh distributions 51 and 52 respectively. Fishbone distribution 81 includes a stem-like metal line corresponding to the spine that is formed in a first direction and branch-like metal lines formed in a second direction. Similarly, fishbone distribution 82 includes a stem-like metal line and branch-like metal lines.

The stem-like metal lines are formed in the first direction in the same metal wiring layer. Similarly, the branch-like metal lines are formed in the same metal wiring layer, in the second direction crossing the stemlike metal lines.

Clock signal CLK is transmitted by fishbone distribution 81 to an internal circuit group corresponding to a block #1. To each of internal circuits 10a provided in block #1, clock signal CLK is transmitted by a line drawn from the nearest node on fishbone distribution 81.

Similarly, in a block #2, clock signal CLK is transmitted by fishbone distribution 82 occupying the region corresponding to block #2. To each of internal circuits 10b provided in block #2, clock signal CLK is transmitted by a line drawn from the nearest node on fishbone distribution 82.

CMOS transmission gates 55 are each electrically coupled between fishbone distributions 81 and 82. The structure of CMOS transmission gates 55 and ON/OFF control thereof are the same as those of the first embodiment and detailed description thereof is not repeated here.

FIG. 8 shows fishbone distributions provided as clock distribution networks to blocks #1 and #2 respectively. However, such fishbone distributions may be provided to any arbitrary blocks. The fishbone-shaped clock distribution networks provide the same effects as those of the first to third embodiments.

Figure 9:
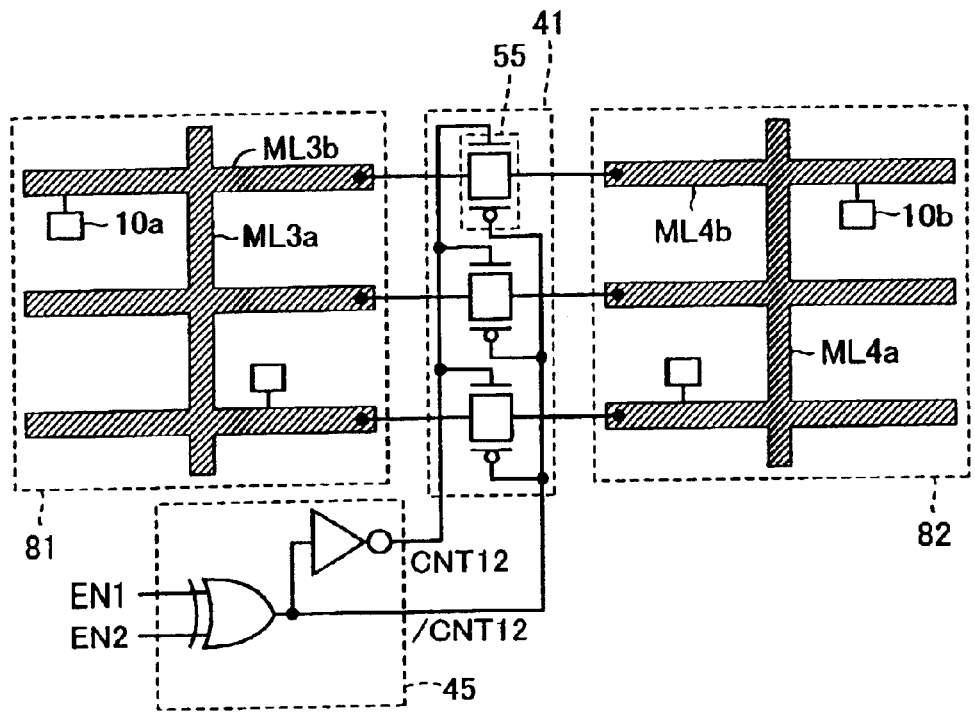
FIG. 9 shows another exemplary arrangement of clock distribution networks and a connection switch according to the fourth embodiment.

Alternatively, as shown in FIG. 9, the same effects can also be provided by exchanging respective directions, i.e., horizontal and vertical directions, in which the stem-like metal lines and the branch-like metal lines are placed that constitute the fishbone distributions. For any of the configurations shown in FIGS. 8 and 9, metal lines formed in the lowest metal wiring layer are selected to be connected by CMOS transmission gates 55 for efficiently arrange MOS transistors constituting CMOS transmission gates 55 in a small area.

Modifications of the Fourth Embodiment

According to modifications of the fourth embodiment described below, clock distribution networks in the shape of the fishbone are used to control supply of the clock signal to a plurality of internal circuit groups that are placed in the same region and should independently be controlled for activation thereof.

Figure 10:
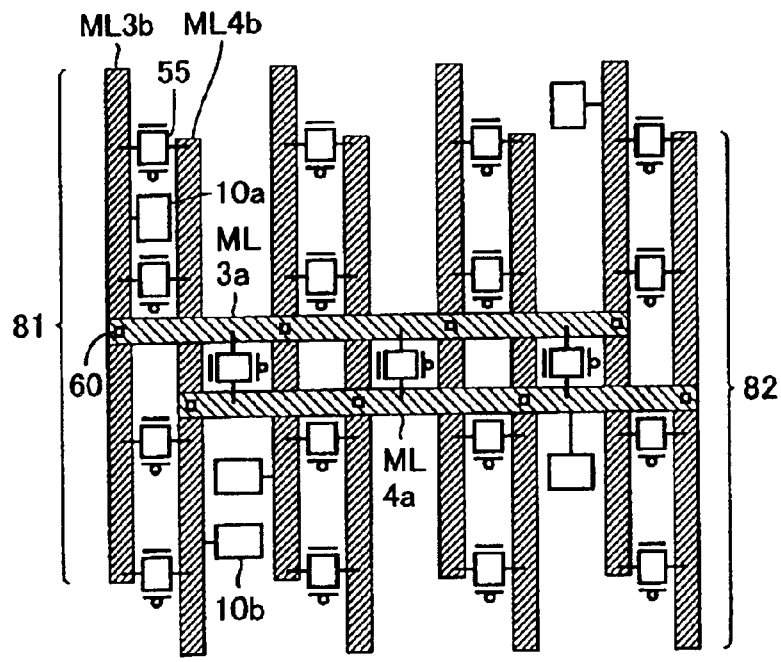
FIGS. 10 to 12 schematically show exemplary arrangements of clock distribution networks and connection switches according to modification of the fourth embodiment.

A configuration of a first modification of the fourth embodiment is shown in FIG. 10 to include fishbone distributions 81 and 82 instead of mesh distributions 51 and 52 in the configuration shown in FIG. 4. A stem-like metal line ML3a of fishbone distribution 81 and a stem-like metal line ML4a of fishbone distribution 82 are formed in the same metal wiring layer. Similarly, blanch-like metal lines ML3b of fishbone distribution 81 and branch-like metal lines ML4b of fishbone distribution 82 are formed in the same metal wiring layer.

Metal lines ML3a and ML3b are electrically coupled by a plurality of through holes 60. Similarly, metal lines ML4a and ML4b are electrically coupled by a plurality of through holes 60.

In the configuration shown in FIG. 10, CMOS transmission gates 55 constituting connection switch 41 are each provided to electrically couple metal lines ML3a and ML4a or ML3b and ML4b formed in the same metal wiring layer over the entire area of fishbone distributions 81 and 82. ON/OFF of each CMOS transmission gate 55 is controlled in the same manner as that of the first embodiment and thus detailed description thereof is not repeated.

This configuration allows, as the configuration shown in FIG. 4, the clock signal to be supplied, with low power consumption and reduced clock skew, to a plurality of internal circuit groups that are controlled differently for activation thereof and that are placed in the same region.

Figure 11:
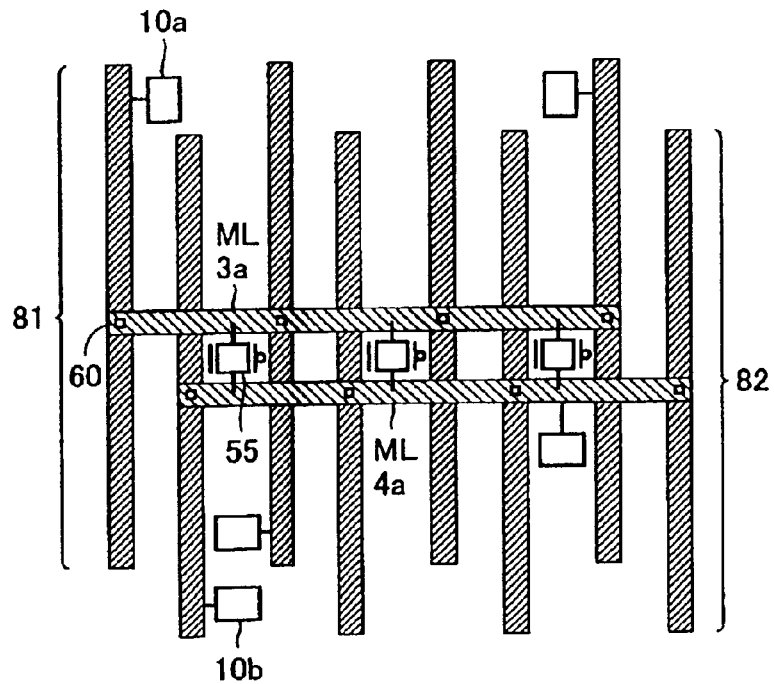

Referring to FIG. 11, according to a second modification of the fourth embodiment, CMOS transmission gates 55 constituting connection switch 41 are each provided to electrically couple stem-like metal lines ML3a and ML4a of fishbone distributions 81 and 82. ON/OFF of each CMOS transmission gate 55 is controlled in the same manner as that of the first embodiment and thus detailed description thereof is not repeated.

By this configuration, the clock skew is made relatively small even if the number of transmission gates 55 is decreased as compared with the configuration shown in FIG. 10.

Figure 12:
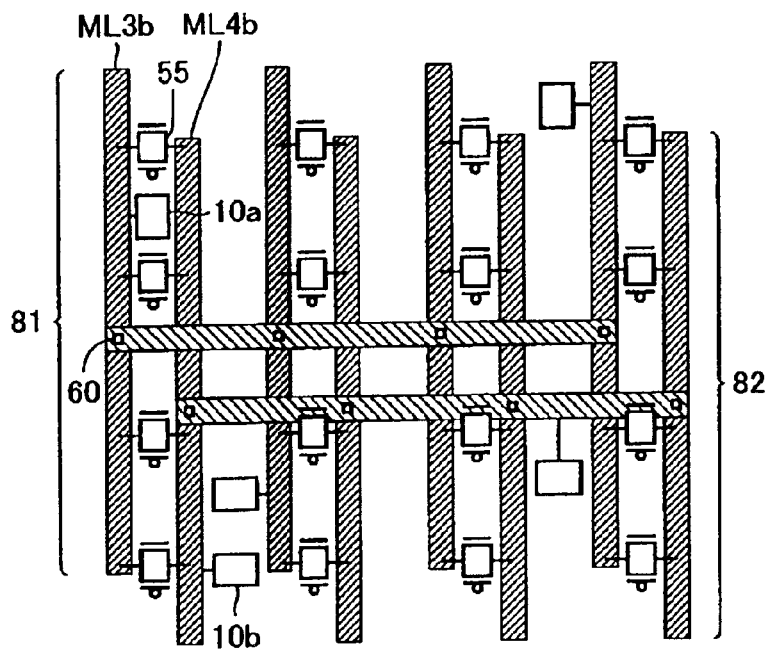

Referring to FIG. 12, according to a third modification of the fourth embodiment, CMOS transmission gates 55 constituting connection switch 41 are each provided to electrically couple branch-like metal lines ML3b and ML4b of fishbone distributions 81 and 82. ON/OFF of each CMOS transmission gate 55 is controlled in the same manner as that of the first embodiment and thus detailed description thereof is not repeated.

By this configuration, the clock skew is made relatively small even if the number of transmission gates 55 is decreased as compared with the configuration shown in FIG. 10.

In particular, in the configuration shown in FIGS. 11 and 12, metal lines connected by the CMOS transmission gates 55 may be placed in the lowest metal wiring layer and thus the MOS transistors constituting the CMOS transmission gates can efficiently be arranged.

The configuration having the fishbone distributions provided as clock distribution networks may be combined with each of the first and third embodiments for use.

Fifth Embodiment

According to a fifth embodiment, a connection switch placed between clock distribution networks has a simplified structure as described below.

Figure 13:
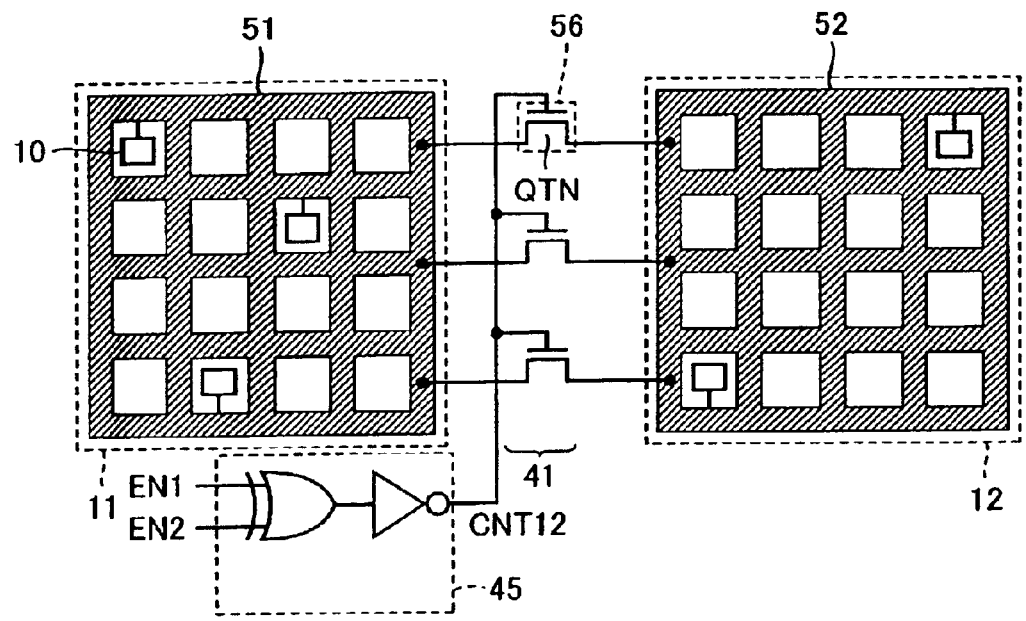
FIG. 13 schematically shows an exemplary arrangement of clock distribution networks and a connection switch according to a fifth embodiment.

Referring to FIG. 13, a configuration according to the fifth embodiment includes a connection switch 41 having NMOS transistors 56 instead of CMOS transmission gates 55. An N-channel MOS transistor QTN constituting NMOS transistor gate 56 is controlled in the same manner as that of the N-channel MOS transistor QTN shown in FIG. 2. This configuration allows the connection switch provided between clock distribution networks to occupy a smaller area.

If both of the clock distribution networks 11 and 12 coupled electrically by NMOS transistor gates 56 are driven by a switch control circuit 45 voltage drop due to the threshold voltage that is a problem of general NMOS transistor gates exerts no adverse influence. In other words, the clock distribution networks can be connected at low impedance even if connection switch 41 is constituted of NMOS transistor gates.

Figure 14:
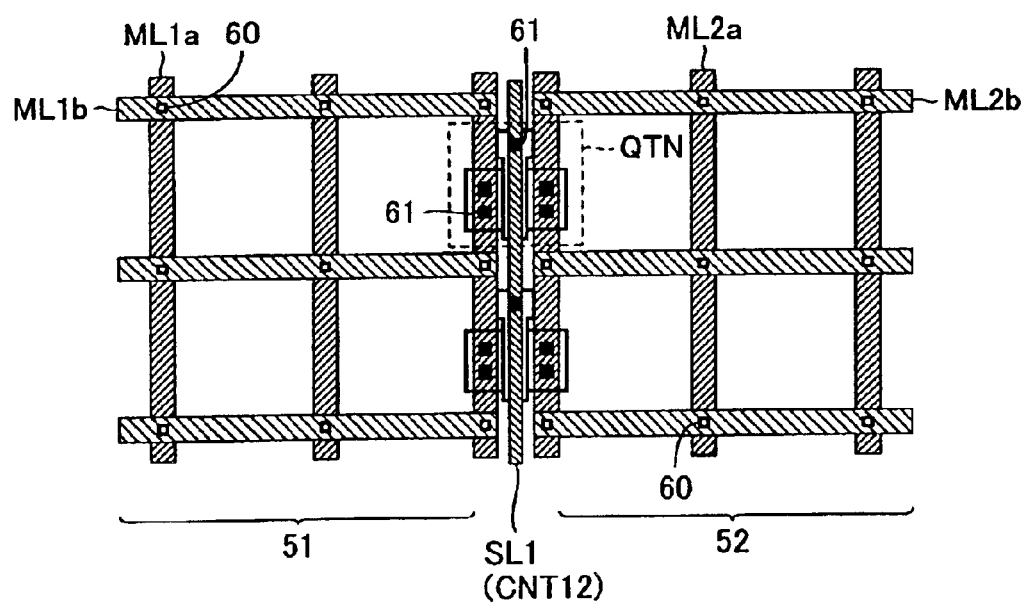
FIG. 14 shows a layout illustrating an arrangement of NMOS transistor gates shown in FIG. 13.

FIG. 14 shows a layout of NMOS transistor gates shown in FIG. 13.

Referring to FIG. 14, the N-channel MOS transistor QTN constituting the NMOS transistor gate has its source and drain regions electrically coupled via contacts 61 to a metal line ML1a of mesh distribution 51 and a metal line ML2a of mesh distribution 52, respectively. The gate of N-channel MOS transistor QTN is coupled to a signal line SL1 via contact 61. In particular, metal lines ML1a and ML2a electrically coupled by the NMOS transistor gate are formed in the lowest metal wiring layer to efficiently arrange MOS transistors constituting NMOS transistor gates as the first embodiment.

The connection switch formed of the NMOS transistor gates of the fifth embodiment may replace the connection switch formed of the CMOS transmission gates of the first to fourth embodiments.

Sixth Embodiment

Figure 15:
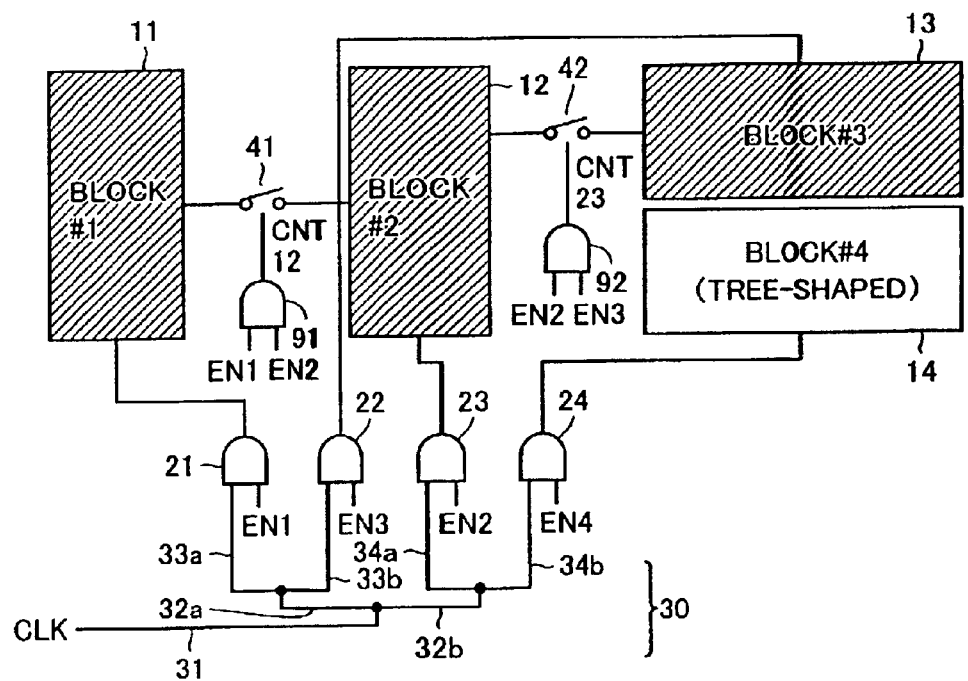
FIG. 15 is a block diagram showing a configuration regarding distribution of a clock signal in a semiconductor integrated circuit device according to a sixth embodiment.

Referring to FIG. 15, a semiconductor integrated circuit device 3 according to a sixth embodiment differs from semiconductor integrated circuit device 1 of the first embodiment in that the former device includes switch control circuits 91 and 92 instead of switch control circuits 45 and 46.

Switch control circuit 91 outputs a control signal CNT12 as a result of AND logic operation for enable signals EN1 and EN2. Similarly, switch control circuit 92 outputs a control signal CNT23 as a result of AND logic operation for enable signals EN2 and EN3.

In the configuration according to the sixth embodiment, if internal circuit groups in both of the clock distribution networks at respective sides of the connection switch are inactivated, these clock distribution networks are not coupled to each other. In this case, clock signal CLK is stopped from being applied to the clock distribution networks and thus the clock skew between the clock distribution networks has no influence on the operation of internal circuits.

If internal circuit groups in both of the clock distribution networks at respective sides of the connection switch are activated, the connection switch is turned on to connect, at low impedance, the clock distribution networks to which the same clock signal CLK with the same phase should be transmitted. Accordingly, it is possible as the first embodiment to substantially reduce the clock skew between clock distribution networks to which the same clock signal CLK should be transmitted with the same timing. Moreover, the AND gate is easier to construct as compared with the comparison (coincidence) gate (exclusive NOR gate) so that the switch control circuit can be constituted in a smaller area.

Figure 16:
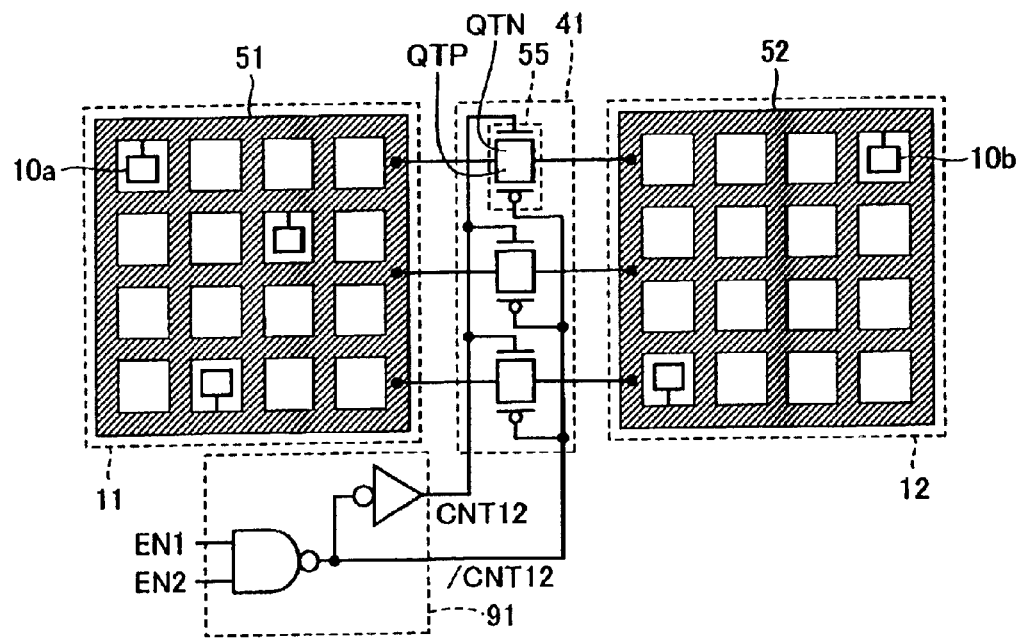
FIG. 16 schematically shows an exemplary arrangement of clock distribution networks and a connection switch shown in FIG. 15.

Referring to FIG. 16, the configuration of the sixth embodiment differs from that of the first embodiment shown in FIG. 2 in that the former includes, instead of switch control circuit 45, switch control circuit 91 constituted of a NAND gate and an inverter. The switch control circuit is thus simply structured to reduce the circuit scale. Other components and operations are similar to those of the first embodiment and detailed description thereof is not repeated.

The switch control circuit of the sixth embodiment may be combined with any of the first to the fifth embodiments for use.

Seventh Embodiment

According to the first to sixth embodiments as described above, a single clock signal is distributed in the semiconductor integrated circuit device. According to a seventh embodiment as discussed below, a plurality of clock signals that are in phase with each other and have different frequencies respectively are distributed.

Figure 17:
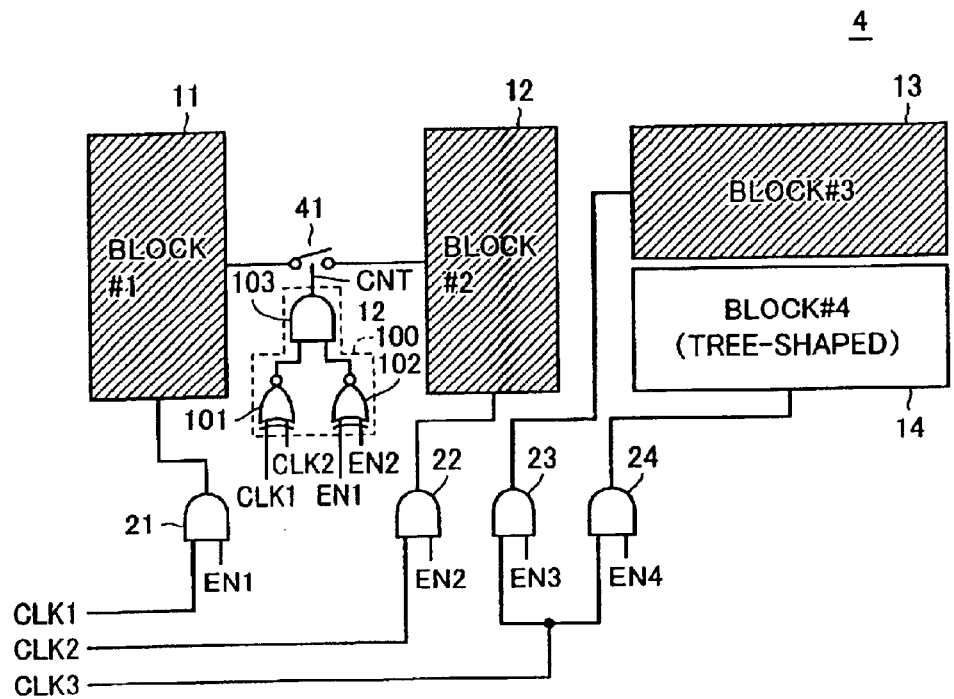
FIG. 17 is a block diagram showing a configuration regarding distribution of a clock signal in a semiconductor integrated circuit device according to a seventh embodiment.

Referring to FIG. 17, a semiconductor integrated circuit device 4 according to the seventh embodiment includes a clock distribution network 11 (block #1) and a clock distribution network 12 (block #2) to which different clock signals CLK1 and CLK2 are supplied respectively. Clock signals CLK1 and CLK2 are in phase with each other. The frequency of clock signal CLK1 is N times (N is an integer of at least 2) as high as that of clock signal CLK2. Another clock signal CLK3 is supplied to clock distribution networks 13 and 14 (blocks #3 and #4).

Figure 18:
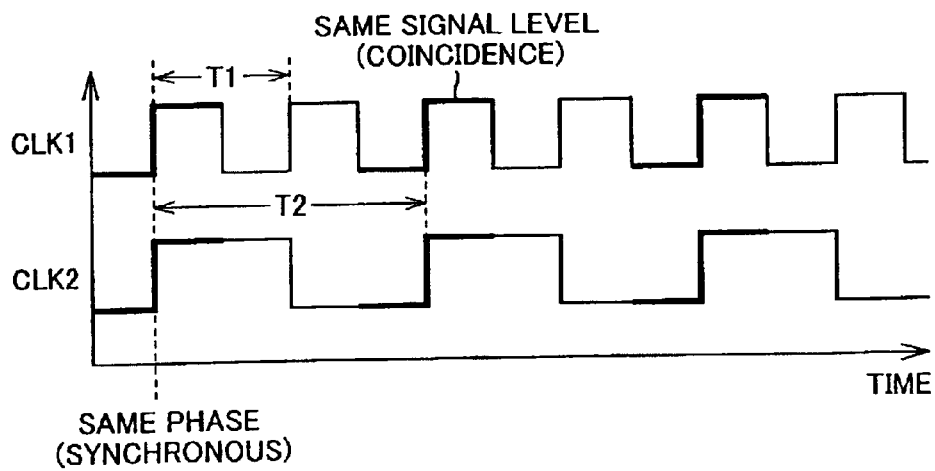
FIG. 18 is a waveform chart specifically illustrating clock signals CLK1 and CLK2 shown in FIG. 17.

Referring to FIG. 18, the seventh embodiment is described supposing that clock signal CLK1 has its frequency twice as high as that of clock signal CLK2 (N=2).

Period T2 of clock signal CLK2 is two (N) times as long as period T1 of clock signal CLK1. Respective phases of clock signals CLK1 and CLK2 match each other and thus respective levels of clock signals CLK1 and CLK2 coincide with each other in the periods as indicated by bold lines in FIG. 18. Then, in these periods, the clock distribution network for transmitting clock signal CLK1 and the clock distribution network for transmitting clock signal CLK2 have the same voltage level.

Referring back to FIG. 17, semiconductor integrated circuit device 4 of the seventh embodiment includes a switch control circuit 100, instead of switch control circuit 45, corresponding to connection switch 41 provided between clock distribution network 11 to which clock signal CLK1 is supplied and clock distribution network 12 to which clock signal CLK2 is supplied.

Switch control circuit 100 includes a logic gate 101 outputting a result of comparison between clock signals CLK1 and CLK2 (exclusive NOR), a logic gate 102 outputting a result of comparison between enable signals EN1 and EN2 (exclusive NOR), and a logic gate 103 outputting a control signal CNT12 as a result of AND logic operation for respective outputs from logic gates 101 and 102.

Control signal CNT12 is thus activated to H level when internal circuits of blocks #1 and #2 are controlled in the same state of activation, i.e., internal circuits are activated in at least both of blocks #1 and #2, in the periods in which clock signals CLK1 and CLK2 have the same signal level (i.e. periods indicated by bold lines in FIG. 18). As the sixth embodiment, the seventh embodiment may be implemented by using an AND gate instead of the exclusive NOR gate for the logic gate 102 controlling activation of internal circuits.

By this configuration, it is possible to reduce clock skew between internal circuits receiving clock signals CLK1 and CLK2 of different frequencies and in phase with each other.

Connection switch 41 may include any of the CMOS transmission gates described in connection with the first embodiment and the NMOS transistor gates described in connection with the fifth embodiment. If a plurality of blocks receive clock signals CLK1 and CLK2, the path for transmitting clock to clock drive control gates 21 and 22 may be constituted of clock buses of the tree structure as the first embodiment. Moreover, any of the mesh and fishbone distributions may be applied to the clock distribution network for each block. The configuration of the seventh embodiment may thus be combined with any of the configurations of the first to sixth embodiments.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a group of clock buses of a hierarchical tree structure provided for transmitting a clock signal;
   a plurality of internal circuits divided into a plurality of blocks, said internal circuits each receiving said clock signal to operate when activated, activation of each of said internal circuits being controlled block by block of said blocks;
   a plurality of clock distribution networks provided correspondingly to said plurality of blocks respectively, each for transmitting said clock signal to said internal circuits of a corresponding one of said blocks; and
   a plurality of clock drive control units provided correspondingly to said plurality of blocks respectively, each for supplying said clock signal from said group of clock buses to a corresponding one of said clock distribution networks, each of said plurality of clock drive control units stopping supply of said clock signal when internal circuits of the corresponding block are inactivated; wherein
   one of said plurality of clock drive control units stops supply of said clock signal to the corresponding clock distribution network irrespective of the activation and inactivation of the internal circuits of the corresponding block,
   said semiconductor integrated circuit device further comprises a connection switch provided between said corresponding clock distribution network corresponding to said one of said clock drive control units and another clock distribution network, and
   said connection switch connects said corresponding clock distribution network and said another clock distribution network at least when internal circuits corresponding to said one of said clock drive control units and internal circuits corresponding to said another clock distribution network are all activated.

2. The semiconductor integrated device according to claim 1, wherein
   said one of said clock drive control units is dispensed with.

3. A semiconductor integrated circuit device comprising:
   a group of clock buses of a hierarchical tree structure provided for transmitting a clock signal;
   a plurality of internal circuits divided into a plurality of blocks, said internal circuits each receiving said clock signal to operate when activated, activation of each of said internal circuits being controlled block by block of said blocks;
   a plurality of clock distribution networks provided correspondingly to said plurality of blocks respectively, each for transmitting said clock signal to said internal circuits of a corresponding one of said blocks;
   a plurality of clock drive control units provided correspondingly to said plurality of blocks respectively, each for supplying said clock signal from said group of clock buses to a corresponding one of said clock distribution networks, each of said plurality of clock drive control units stopping supply of said clock signal when internal circuits of the corresponding block are inactivated; and
   a connection switch provided between one clock distribution network and another clock distribution network of said plurality of clock distribution networks, wherein
   said connection switch connects said one clock distribution network and said another clock distribution network at least when internal circuits corresponding to said one clock distribution network and internal circuits corresponding to said another clock distribution network are all activated.

4. The semiconductor integrated circuit device according to claim 3, where
   said connection switch includes a CMOS transmission gate electrically coupled between said one clock distribution network and said another clock distribution network.

5. The semiconductor integrated circuit device according to claim 3, wherein
   said connection switch includes an NMOS transistor gate electrically coupled between said one clock distribution network and said another clock distribution network.

6. The semiconductor integrated circuit device according to claim 3, wherein
   said connection switch is turned on/off according to a result of AND operation for a first enable signal and a second enable signal, said first enable signal controlling activation and inactivation of internal circuits corresponding to said one clock distribution network and said second enable signal controlling activation and inactivation of internal circuits corresponding to said another clock distribution network.

7. The semiconductor integrated circuit device according to claim 3, wherein
   said clock distribution networks are each formed of a plurality of metal lines formed respectively in a plurality of metal wiring layers deposited on a semiconductor substrate and said metal lines are electrically coupled to each other through a via hole, and
   said connection switch includes a transistor electrically coupled between one of said plurality of metal lines forming said one clock distribution network and one of said plurality of metal lines forming said another clock distribution network, and said metal lines between which said transistor is electrically coupled are each located in the lowest one of said metal wiring layers.

8. A semiconductor integrated circuit device comprising:
   a group of clock buses of a hierarchical tree structure provided for transmitting a clock signal;
   a plurality of internal circuits divided into a plurality of blocks, said internal circuits each receiving said clock signal to operate when activated, activation of each of said internal circuits being controlled block by block of said blocks;
   a plurality of clock distribution networks provided correspondingly to said plurality of blocks respectively, each for transmitting said clock signal to said internal circuits of a corresponding one of said blocks;

a plurality of clock drive control units provided correspondingly to said plurality of blocks respectively, each for supplying said clock signal from said group of clock buses to a corresponding one of said clock distribution networks, each of said plurality of clock drive control units stopping supply of said clock signal when internal circuits of the corresponding block are inactivated, and said clock distribution networks being each in the shape of a grid formed of first clock lines arranged in a first direction and second clock lines arranged in a second direction; and a plurality of connection switches provided between one clock distribution network and another clock distribution network of said plurality of clock distribution networks, said one and another clock distribution networks being placed in the same region, wherein
said connection switches are each turned on when internal circuits corresponding to said one clock distribution network and internal circuits corresponding to said another clock distribution network are all activated, and
said plurality of connection switches are placed correspondingly to respective vertexes of said grid.

9. A semiconductor integrated circuit device comprising:
a group of clock buses of a hierarchical tree structure provided for transmitting a clock signal;
a plurality of internal circuits divided into a plurality of blocks, said internal circuits each receiving said clock signal to operate when activated, activation of each of said internal circuits being controlled block by block of said blocks;
a plurality of clock distribution networks provided correspondingly to said plurality of blocks respectively, each for transmitting said clock signal to said internal circuits of a corresponding one of said blocks;
a plurality of clock drive control units provided correspondingly to said plurality of blocks respectively, each for supplying said clock signal from said group of clock buses to a corresponding one of said clock distribution networks, each of said plurality of clock drive control units stopping supply of said clock signal when internal circuits of the corresponding block are inactivated, and said clock distribution networks being each in the shape of a grid formed of first clock lines arranged in a first direction and second clock lines arranged in a second direction; and
a plurality of connection switches provided between one clock distribution network and another clock distribution network of said plurality of clock distribution networks, said one and another clock distribution networks being placed in the same region, wherein
said connection switches are each turned on when internal circuits corresponding to said one clock distribution network and internal circuits corresponding to said another clock distribution network are all activated, and
said plurality of connection switches are placed between said first clock lines or between said second clock lines.

10. The semiconductor integrated circuit device according to claim 9, wherein
said plurality of connection switches include transistors placed between said first clock lines or between said second clock lines, and the clock lines between which said transistors are placed are located under remaining clock lines between which no transistor is placed.

11. A semiconductor integrated circuit device comprising:
a group of clock buses of a hierarchical tree structure provided for transmitting a clock signal;
a plurality of internal circuits divided into a plurality of blocks, said internal circuits each receiving said clock signal to operate when activated,
activation of each of said internal circuits being controlled block by block of said blocks;
a plurality of clock distribution networks provided correspondingly to said plurality of blocks respectively, each for transmitting said clock signal to said internal circuits of a corresponding one of said blocks;
a plurality of clock drive control units provided correspondingly to said plurality of blocks respectively, each for supplying said clock signal from said group of clock buses to a corresponding one of said clock distribution networks, each of said plurality of clock drive control units stopping supply of said clock signal when internal circuits of the corresponding block are inactivated, said clock distribution networks being each in the shape of a fishbone formed of a main clock line placed in a first direction and sub clock lines placed in a second direction; and
a plurality of connection switches provided between one clock distribution network and another clock distribution network of said plurality of clock distribution networks, said one and another clock distribution networks being placed in the same region, wherein
said connection switches are each turned on when internal circuits corresponding to said one clock distribution network and internal circuits corresponding to said another clock distribution network are all activated, and
said plurality of connection switches are placed between said main clock lines or between said sub clock lines.

12. The semiconductor integrated circuit device according to claim 11, wherein
said plurality of connection switches include transistors placed between said main clock lines or between said sub clock lines, the clock lines between which said transistors are placed are located under remaining clock lines between which no transistor is placed.

13. A semiconductor integrated circuit device comprising:
a plurality of first internal circuits divided into a plurality of first blocks, said first internal circuits each receiving a first clock signal to operate when activated;
a plurality of second internal circuits divided into a plurality of second blocks, said second internal circuits each activated with receiving a second clock signal to operate, said second clock signal having a frequency N times (N: integer of at least 2) as high as that of said first clock signal and being in phase with said first clock signal,
activation of said first and second internal circuits being controlled block by block of said first and second blocks;
a plurality of first clock distribution networks provided correspondingly to said plurality of first blocks respectively, for transmitting said first clock signal to said first internal circuits of corresponding first blocks respectively;
a plurality of second clock distribution networks provided correspondingly to said plurality of second blocks respectively, for transmitting said second clock signal to said second internal circuits of corresponding second blocks respectively; and a connection switch provided between one of said first clock distribution networks and one of said second clock distribution networks, said connection switch connecting said one of said first clock distribution networks and said one of said second clock distribution networks at least when the first internal circuits corresponding to said one of first clock distribution networks and the second intein3l circuits corresponding to said one of second clock distribution networks are all activated in a period in which respective levels of said first and second clock signals coincide with each other.

14. The semiconductor integrated circuit device according to claim 13, further comprising:

a first group of clock buses of a hierarchical tree structure for transmitting said first clock signal;

a second group of clock buses of a hierarchical tree structure for transmitting said second clock signal;

a plurality of first clock drive control units provided correspondingly to said plurality of first blocks respectively, each for supplying said first clock signal from said first group of clock buses to a corresponding one of said first clock distribution networks; and a plurality of second clock drive control units provided correspondingly to said plurality of second blocks respectively, each for supplying said second clock signal from said second group of clock buses to a corresponding one of said second clock distribution networks, wherein each of said first and second clock drive control units stops supply of said first or second clock signal when the first or second internal circuits of the corresponding first or second block are inactivated.

15. The semiconductor integrated circuit device according to claim 13, further comprising a switch control circuit generating a switch control signal for controlling on and off of said connection switch, said switch control circuit including a comparison gate receiving said first and second clock signals, an AND operation gate receiving a first enable signal and a second enable signal, said first enable signal controlling activation and inactivation of first internal circuits corresponding to said one of first clock distribution networks and said second enable signal controlling activation and inactivation of second internal circuits corresponding to said one of second clock distribution networks, and a logic gate generating said switch control signal according to respective outputs of said comparison gate and said AND operation gate.

\* \* \* \* \*